US009847484B2

(12) United States Patent
Kim et al.

(10) Patent No.: US 9,847,484 B2
(45) Date of Patent: Dec. 19, 2017

(54) MASK AND METHOD OF MANUFACTURING DISPLAY DEVICE BY USING THE SAME

(71) Applicant: Samsung Display Co., Ltd., Yongin-si, Gyeonggi-do (KR)

(72) Inventors: Hyojin Kim, Yongin-si (KR); Junmo Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/981,696

(22) Filed: Dec. 28, 2015

(65) Prior Publication Data
US 2016/0343945 A1    Nov. 24, 2016

(30) Foreign Application Priority Data

May 19, 2015   (KR) .................. 10-2015-0069439

(51) Int. Cl.
| | | |
|---|---|---|
| *H01L 51/00* | (2006.01) | |
| *C23C 14/04* | (2006.01) | |
| *B05B 15/04* | (2006.01) | |

(52) U.S. Cl.
CPC ........ *H01L 51/0011* (2013.01); *C23C 14/042* (2013.01); *B05B 15/045* (2013.01)

(58) Field of Classification Search
CPC ..................................................... H01L 51/56
See application file for complete search history.

(56) References Cited

U.S. PATENT DOCUMENTS

| | | | |
|---|---|---|---|
| 2008/0296600 A1 | 12/2008 | Kwack et al. | |
| 2011/0168087 A1 | 7/2011 | Lee et al. | |
| 2012/0062104 A1 | 3/2012 | Kwack et al. | |
| 2012/0146492 A1* | 6/2012 | Ryu | H01L 51/5256 313/512 |
| 2012/0266813 A1* | 10/2012 | Hong | C23C 14/044 118/505 |
| 2013/0026533 A1 | 1/2013 | Lee | |
| 2014/0239049 A1* | 8/2014 | Kang | B23K 31/02 228/101 |

(Continued)

FOREIGN PATENT DOCUMENTS

| | | | | |
|---|---|---|---|---|
| JP | 2014-133934 A | | 7/2014 | |
| KR | 1020060072073 | * | 7/2006 | ............. H05B 33/10 |

(Continued)

OTHER PUBLICATIONS

English Abstract and Partial English translation of relevant part of JP 2014-133934 A, dated Jul. 24, 2014, listed above, 3 pages.

(Continued)

*Primary Examiner* — Kyoung Lee
*Assistant Examiner* — Christina Sylvia
(74) *Attorney, Agent, or Firm* — Lewis Roca Rothgerber Christie LLP (57) ABSTRACT

A mask includes: a frame; and a mask base attached to the frame, having an opening such that light is illuminated, and including a first surface and a second surface that is opposite to the first surface, and the mask base has a welding portion at an outer portion of the mask base and a half-etching portion in at least a portion of the first surface and/or the second surface of the mask base.

13 Claims, 9 Drawing Sheets

(56) References Cited

U.S. PATENT DOCUMENTS

2014/0315343 A1    10/2014   Kim
2016/0144393 A1*    5/2016   Kwon ...................... G03F 7/40
                                                                                               118/504

FOREIGN PATENT DOCUMENTS

| KR | 10-2006-0104287 A | 10/2006 |
| KR | 10-2008-0011571 | 2/2008 |
| KR | 10-2008-0105308 | 12/2008 |
| KR | 10-2011-0082416 A | 7/2011 |
| KR | 10-2012-0027992 | 3/2012 |
| KR | 10-2012-0120703 A | 11/2012 |
| KR | 10-2013-0014104 | 2/2013 |
| KR | 10-2014-0124997 A | 10/2014 |

OTHER PUBLICATIONS

English Abstract and Partial English translation of relevant part of KR 10-2008-0011571, dated Feb. 5, 2008, listed above, 2 pages.
KIPO Office Action dated Aug. 12, 2016, for corresponding Korean Patent Application No. 10-2015-0069439 (6 pages).

* cited by examiner

MASK AND METHOD OF MANUFACTURING DISPLAY DEVICE BY USING THE SAME

CROSS-REFERENCE TO RELATED APPLICATION

This application claims priority to, and the benefit of, Korean Patent Application No. 10-2015-0069439, filed on May 19, 2015, in the Korean Intellectual Property Office, the disclosure of which is incorporated herein in its entirety by reference.

BACKGROUND

1. Field

One or more exemplary embodiments relate to a mask and a method of manufacturing a display device using the same.

2. Description of the Related Art

A flat panel display device, such as an organic light-emitting display device, may be manufactured with a slim profile as a flexible product in light of the organic light-emitting display device's driving characteristics. As such, research into organic light-emitting display devices is being performed. However, the organic light-emitting display device has a characteristic that a display portion is deteriorated by penetration of oxygen or moisture. Therefore, to prevent or substantially prevent penetration of oxygen or moisture from the outside, the organic light-emitting display device uses an encapsulation structure for sealing and protecting the display portion.

Recently, as an encapsulation structure, a thin film encapsulation structure that covers the display portion with alternating layers, in which an organic layer and an inorganic layer are alternately stacked, has been widely adopted. That is, a structure that forms an encapsulation structure by alternately stacking an organic layer and an inorganic layer on the display portion of a substrate has been used.

However, a situation where a portion of a deposited organic layer-forming material is not fully cured has occurred during a process of stacking the organic layer in the thin film encapsulation structure.

Generally, when an organic layer is formed, a mask corresponding to the relevant layer is located on a substrate, and a monomer in a liquid state is vapor-deposited and then cured with ultraviolet (UV) light to form a polymer. At this point, the monomer in a liquid state may overflow to a portion hidden by the mask, and UV light might not be properly illuminated to the portion, and thus an uncured organic material occurs.

SUMMARY

One or more exemplary embodiments include a mask and a method of manufacturing a display device by using the same.

Additional aspects will be set forth in part in the description which follows and, in part, will be apparent from the description, or may be learned by practice of the presented embodiments.

According to one or more exemplary embodiments, a mask includes: a frame; and a mask base attached to the frame, having an opening through which light is illuminated, and including a first surface and a second surface that is opposite to the first surface, wherein the mask base has a welding portion at an outer portion of the mask base and a half-etching portion in at least a portion of the first surface and/or the second surface.

The half-etching portion may extend along an edge of four sides of the mask base.

The half-etching portion may be between the opening in an outermost portion of the mask base and the welding portion.

The half-etching portion may be in a corner of the mask base.

The half-etching portion may be inside the welding portion.

The half-etching portion may be in a pattern across an entire surface of the mask base except the opening.

The mask may be used for curing an organic thin film encapsulation layer with ultraviolet light.

According to one or more exemplary embodiments, a method of manufacturing a display device includes: forming a display portion on a substrate; preparing a mask including: a frame; and a mask base including: a first surface; and a second surface, and wherein a half-etching portion is formed in at least a portion of the first surface and/or the second surface of the mask base; forming an organic layer via the mask; preparing a mask for an inorganic layer; and forming the inorganic layer that covers all of the formed organic layer via the mask for the inorganic layer.

The preparing of the mask may include: forming the half-etching portion in the mask base; and welding the mask base to the frame.

The display portion may include an organic light-emitting device.

Exemplary embodiments may prevent the non-curing of an organic layer forming material when an organic layer is formed by increasing flexibility of a mask.

Features of exemplary embodiments may be derived from the content described below with reference to the drawings in addition to the above-described content.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Embodiments of the present invention allow for various changes and numerous embodiments, exemplary embodiments will be illustrated in the drawings and described in detail in the written description. Features of embodiments of the present invention, and a method for accomplishing these, will be apparent when exemplary embodiments described below in detail are referred together with the drawings. However, the present invention is not limited to exemplary embodiments described below and may be implemented in various suitable forms.

Hereinafter, exemplary embodiments are described in detail with reference to the accompanying drawings. Like reference numerals are used for like or corresponding elements or components when description is made with reference to the drawings, and repeated description thereof is omitted.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

Sizes of elements or components in the drawings may be exaggerated for convenience of explanation. In other words, since sizes and thicknesses of components in the drawings may be arbitrarily illustrated for convenience of explanation, the following embodiments are not limited thereto.

Exemplary embodiments may be implemented differently and a specific process order may be performed differently from the described order. For example, two consecutively described processes may be performed substantially at the same time or performed in an order opposite to the described order.

Figure 1:
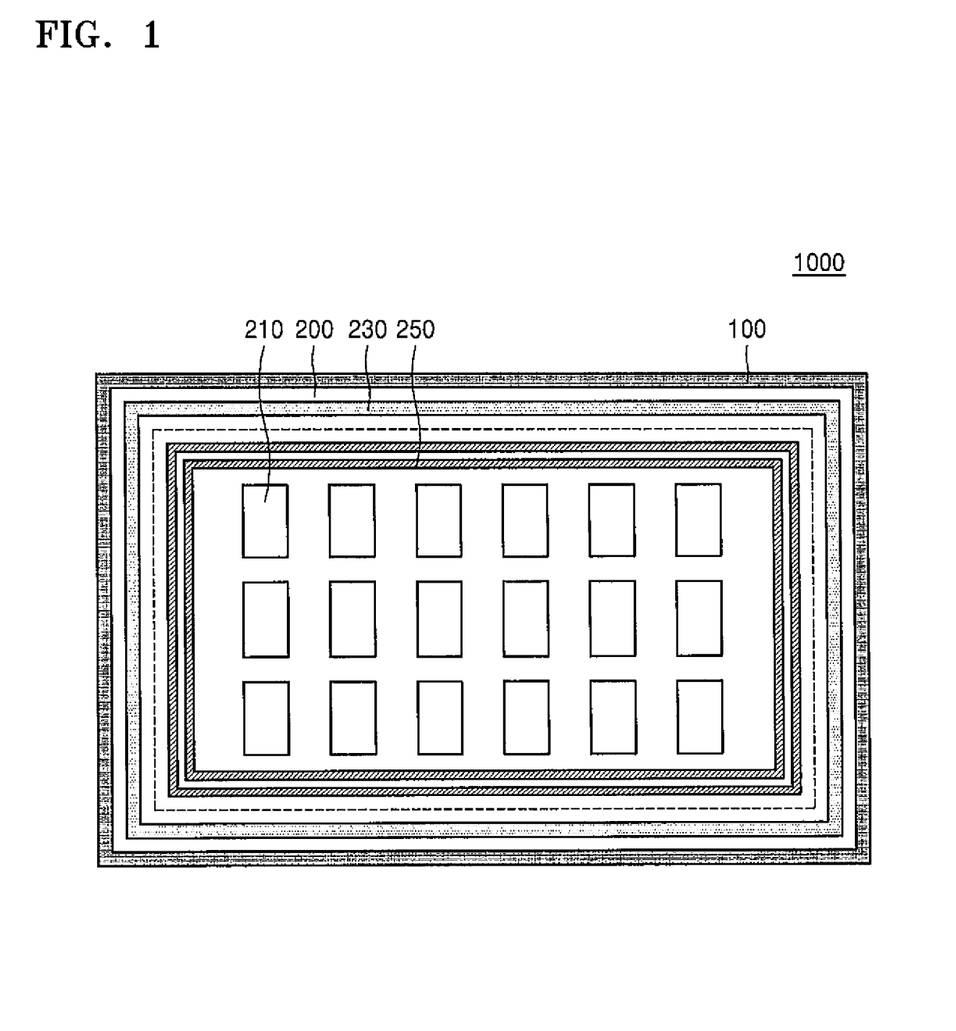
FIG. 1 is a schematic plan view illustrating a mask according to an exemplary embodiment.
Figure 2A:
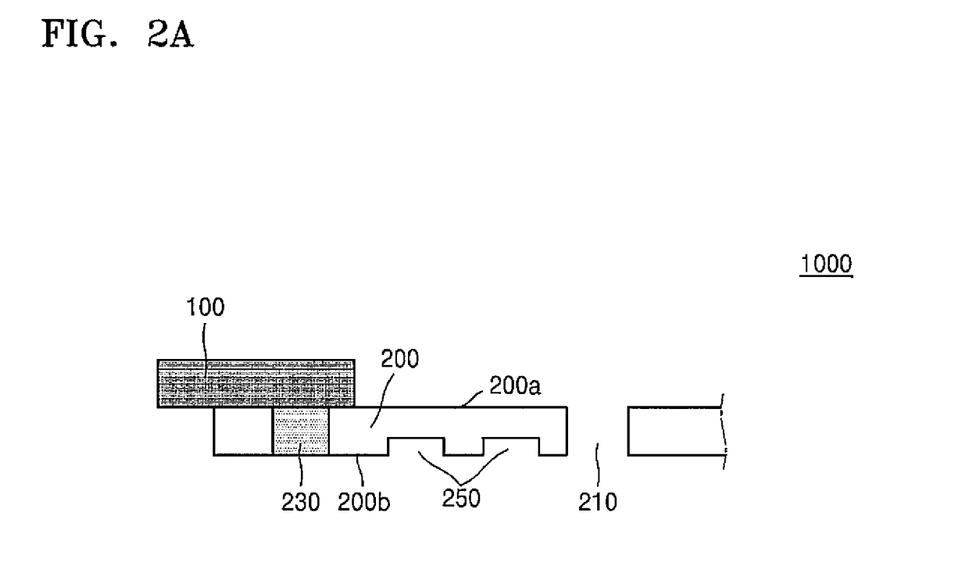
FIG. 2A is a schematic cross-sectional view illustrating a portion of a mask illustrated in FIG. 1 according to an exemplary embodiment.
Figure 2B:
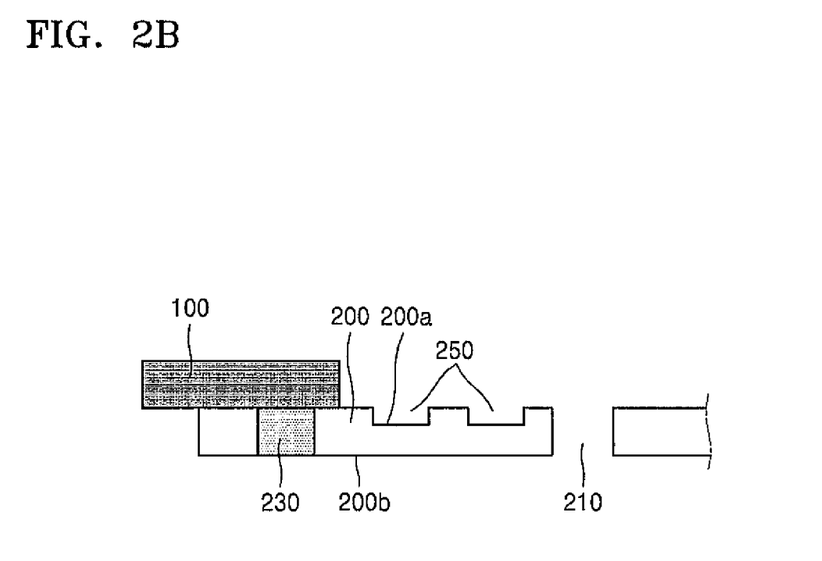
FIG. 2B is a schematic cross-sectional view illustrating a portion of a mask illustrated in FIG. 1 according to another exemplary embodiment.
Figure 2C:
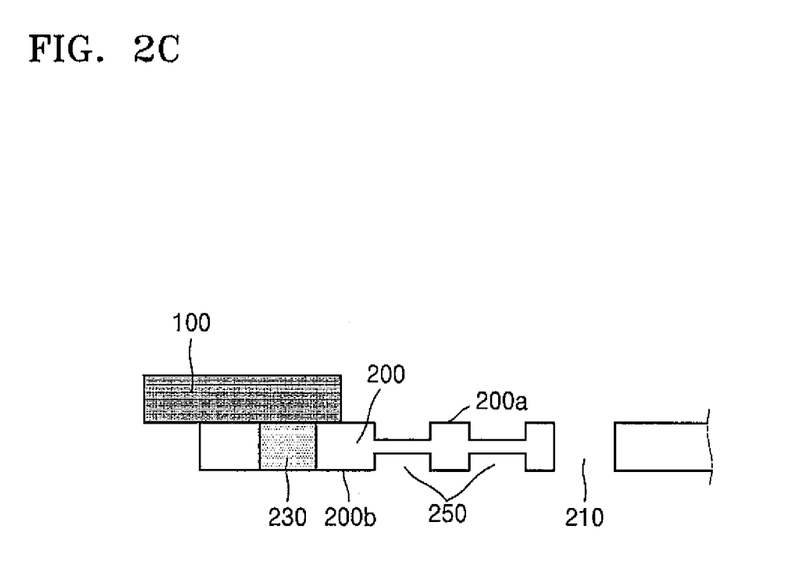
FIG. 2C is a schematic cross-sectional view illustrating a portion of a mask illustrated in FIG. 1 according to still another exemplary embodiment.

FIG. 1 is a schematic plan view illustrating a mask 1000 according to an exemplary embodiment, FIG. 2A is a schematic cross-sectional view illustrating a portion of the mask 1000 illustrated in FIG. 1 according to an exemplary embodiment, FIG. 2B is a schematic cross-sectional view illustrating a portion of the mask 1000 illustrated in FIG. 1 according to another exemplary embodiment, and FIG. 2C is a schematic cross-sectional view illustrating a portion of the mask 1000 illustrated in FIG. 1 according to still another exemplary embodiment.

As illustrated in FIG. 1, the mask 1000 according to the exemplary embodiment may include a frame 100 and a mask base 200 attached to the frame 100. The frame 100 may support the mask base 200, and may include metal, plastic, etc., but is not limited thereto.

The mask base 200 may include Invar (INVAR is a registered trademark of Aperam Alloys IMPHY Joint Stock Company), which is an alloy of Fe and Ni, although the mask base 200 is not limited thereto. Two or more openings 210 may be formed in the mask base 200 so that light may be illuminated to the mask base 200. Though FIG. 1 illustrates specific dimensions and a specific number of openings 210 according to an exemplary embodiment, the dimensions and the number of openings 210 are not limited thereto, and may be changed as desired.

Referring to FIGS. 2A to 2C, one side of the mask base 200 may be referred to as a first surface 200*a*, and a surface opposite to the first surface 200*a* may be referred to as a second surface 200*b*.

In the mask 1000 according to an exemplary embodiment, the mask base 200 may be attached to the frame 100 by welding. That is, an outer portion of the mask base 200 may be attached via welding along contacting edges of the mask base 200 and the frame 100. Accordingly, as illustrated in FIG. 1, a welding portion 230 may extend along each side at the outer portion of the mask base 200. The welding portion 230 may be formed in a welding line shape.

To attach the mask base 200 to the frame 100, the periphery of the mask base 200 may be extended to, and welded to, the frame 100. That is, the mask base 200 is welded to the frame 100 along the welding portion 230, and consequently, the flexibility of the outer portion of the mask base 200 deteriorates by being reinforced via the welding portion 230.

Conventionally, the outer portion of a mask base receives downward force during a process of depositing a thin film, and thus contact force between a substrate, on which the thin film is deposited, and a mask becomes weak at the outer portion of the mask. Also, as described above, the flexibility of the outer portion of the mask base deteriorates.

Consequently, in the case of forming an organic layer by using the typical mask, contact force between the mask and a deposited substrate becomes weak at the outer portion of the mask, and an organic material that is in a liquid state may spread due to a capillary phenomenon between the substrate and the mask. As described above, an organic material that overflows between the substrate and the mask might not be cured because ultraviolet (UV) light might not be illuminated to the organic material during a polymerization operation, and this uncured organic material may cause a product to be defective.

The mask 1000 according to an exemplary embodiment may include a half-etching portion 250 formed in at least a portion of the first surface 200*a* and/or the second surface 200*b* as illustrated in FIG. 1. The half-etching portion 250 of the mask 1000 may extend along the edges of four sides of the mask base 200, as illustrated in FIG. 1. A forming position and a forming degree of the half-etching portion 250 are not limited to that which is illustrated, and the half-etching portion 250 may be formed at other locations in the mask base 200.

As illustrated in FIGS. 2A to 2C, the half-etching portion 250 may be formed in the first surface 200*a* (FIG. 2B) or in the second surface 200*b* (FIG. 2A) of the mask base 200. Also, the half-etching portion 250 may be formed in both the first surface 200*a* and the second surface 200*b* (FIG. 2C).

Hereinafter, for convenience in description, the cross-section of the mask 1000 according to an exemplary embodiment illustrated in FIG. 1 is described for the case that the half-etching portion 250 is formed in the second surface 200*b*, as illustrated in FIG. 2A. As described above, the forming position of the half-etching portion 250 of the mask is not limited to the second surface 200*b*.

When the half-etching portion 250 is formed in the mask base 200, the surface area of the mask base 200 widens at the portion where the half-etching portion 250 is formed. Also, because the half-etching portion 250 is formed by etching a portion of the mask base 200, the flexibility of the mask base 200 may increase.

In the mask 1000 according to an exemplary embodiment, the half-etching portion 250 may be formed in the edges of the four sides of the mask base 200. In other words, the half-etching portion 250 may be formed between the welding portion 230, which is a portion where contact force is lowest, and the openings 210 formed in the outermost portion as illustrated in FIG. 1.

That is, because the half-etching portion 250 is formed in the outer portion of the mask base 200 (between the welding portion 230 and the openings 210 formed in the outermost portion), the flexibility of the mask base 200 may increase. Because the flexibility of the mask base 200 may increase, contact force between a substrate 10 (refer to FIG. 5), which is an object on which a material is deposited in the outer portion, and the mask 1000 may increase.

Figure 3:
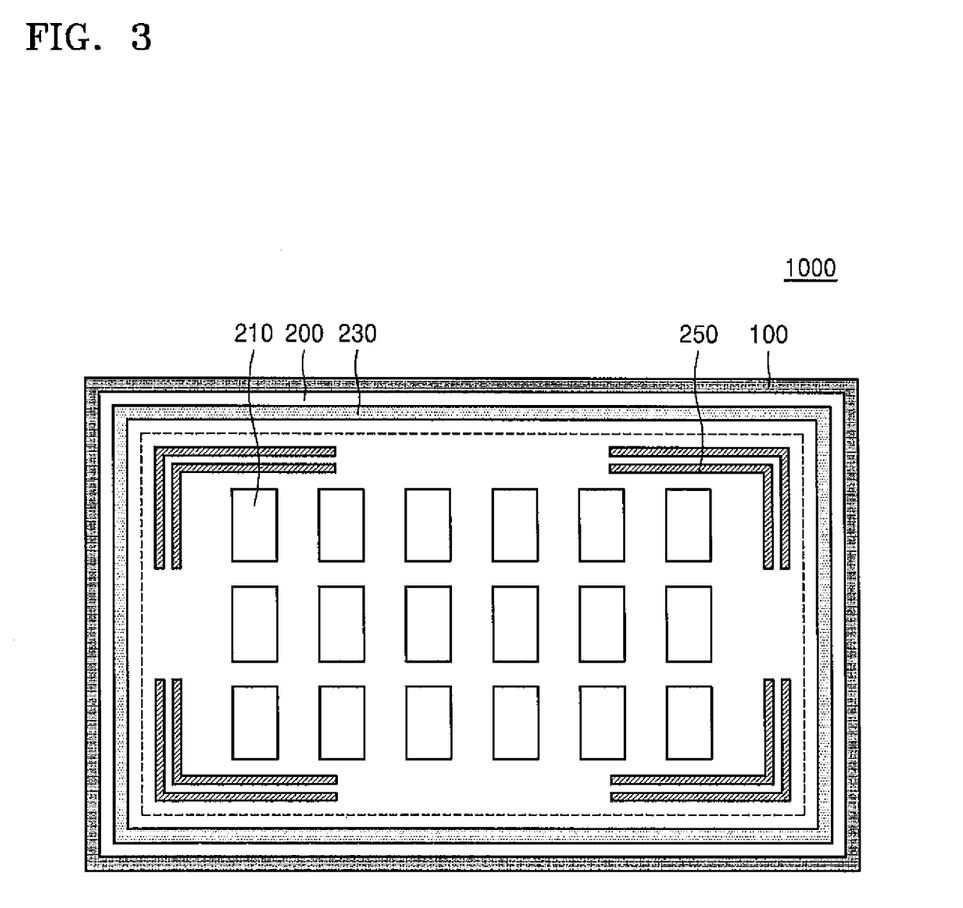
FIG. 3 is a schematic plan view illustrating a mask according to another exemplary embodiment.

FIG. 3 is a schematic plan view illustrating a mask 1000 according to another exemplary embodiment. In FIG. 3, like reference numerals used in FIGS. 1 to 2C represent like members, and repeated descriptions of the like members may be omitted for conciseness of description.

As illustrated in FIG. 3, the half-etching portion 250 may be formed in the corner portions of the mask base 200. That is, referring to FIG. 3, the half-etching portions 250 may be respectively formed at four corner portions of the mask base 200.

Referring to FIG. 3, in the mask 1000 according to an exemplary embodiment, the half-etching portion 250 may be formed between the openings 210 formed in the outermost portion and the welding portion 230 at the corner portions of the mask base 200.

In the present exemplary embodiment, like the above exemplary embodiment, the half-etching portion 250 might be formed in only the corner portion of the first surface 200*a*, formed in only the corner portion of the second surface 200*b*, or formed in all of the corner portions of the first surface 200*a* and the second surface 200*b* (e.g., the corner portions of both surfaces).

The mask base 200 is extended to, and welded to, the frame 100, and thus, the welding portion 230 is formed. Therefore, the outer portion of the mask base 200 receives tensile force, and the welding portion 230 also receives force, so that contact force between the mask 1000 and the substrate 10 (refer to FIG. 5), on which a thin film is deposited, may become weak at the outer portion of the mask 1000. However, in the mask according to an exemplary embodiment, because the half-etching portion 250 is at the corner portions of the mask base 200, as illustrated in FIG. 3, and because flexibility increases, contact force between the substrate 10 (refer to FIG. 5) and the mask 1000 improves.

Accordingly, an organic material overflow between the substrate 10 (refer to FIG. 5) and the mask 1000 may be avoided, and formation of a defective display device due to an uncured organic material may also be avoided. Because the half-etching portion 250 is formed between the opening 210 formed in the outermost portion (where contact force is weakest) and the welding portion 230, the flexibility of the mask base 200 may be increased.

Figure 4:
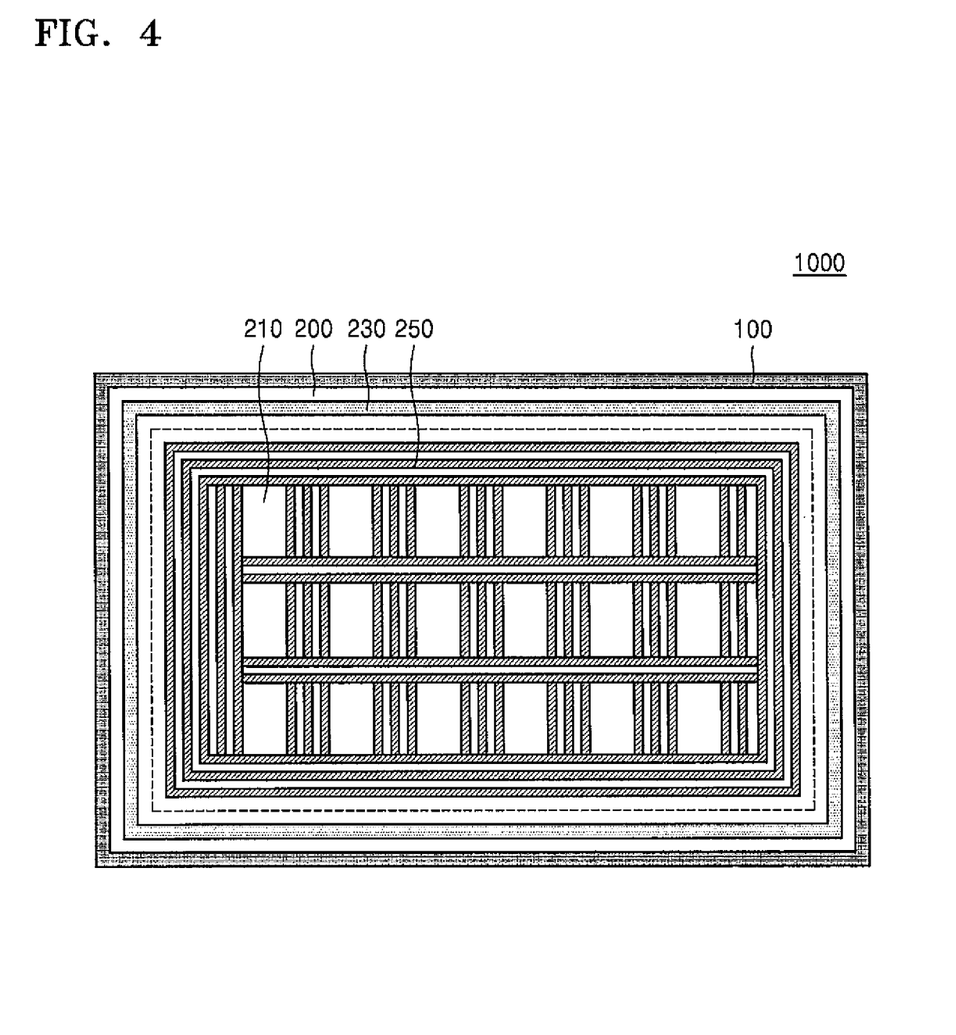
FIG. 4 is a schematic plan view illustrating a mask according to still another exemplary embodiment.

FIG. 4 is a schematic plan view illustrating a mask according to still another exemplary embodiment. In FIG. 4, like reference numerals used in FIGS. 1 to 2C represent like members, and repeated descriptions of the like members may be omitted for conciseness of description.

In the mask 1000 according to an exemplary embodiment, the half-etching portion 250 may be formed in a pattern across an entire surface of the mask base 200, as illustrated in FIG. 4.

Because the half-etching portion 250 is formed in the pattern across the entire surface of the mask base 200, the flexibility of the entire mask base 200 may increase, and thus deterioration of the contact force between the mask 1000 and the substrate 10, on which a thin film is deposited, may be avoided. Consequently, a spread of an organic material between the substrate 10 and a mask, and a defect that may occur due to an uncured organic material, may be avoided.

Forming the half-etching portion 250 in the pattern across the entire surface of the mask base 200 is only an exemplary embodiment, and the forming position and forming degree of the half-etching portion 250 are not limited to the descriptions above. That is, the half-etching portion 250 may be formed anywhere as long as the half-etching portion 250 is formed in the mask base 200, and forming the half-etching portion 250 in at least one portion of the mask base 200 corresponds to an exemplary embodiment.

Like the above-described exemplary embodiment, in the present exemplary embodiment, the half-etching portion 250 may be formed in a pattern across the entire first surface 200a, formed in a pattern across the entire second surface 200b, or formed in a pattern across both the entire first surface 200a and the entire second surface 200b.

Figure 5:
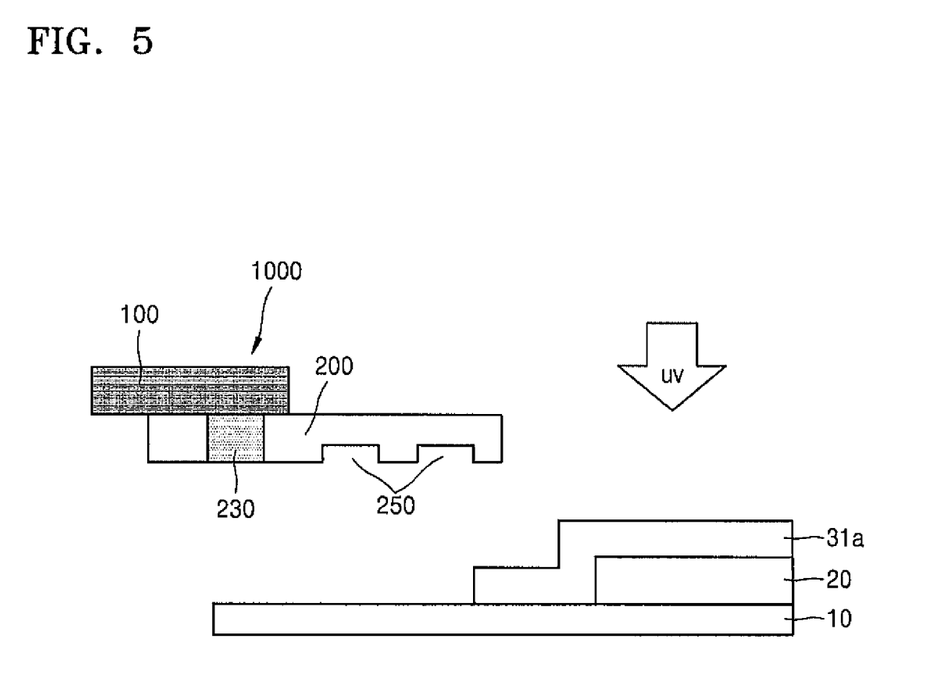
FIG. 5 is a cross-sectional view illustrating an operation of forming an organic layer of a display device by using a mask according to an exemplary embodiment.
Figure 6:
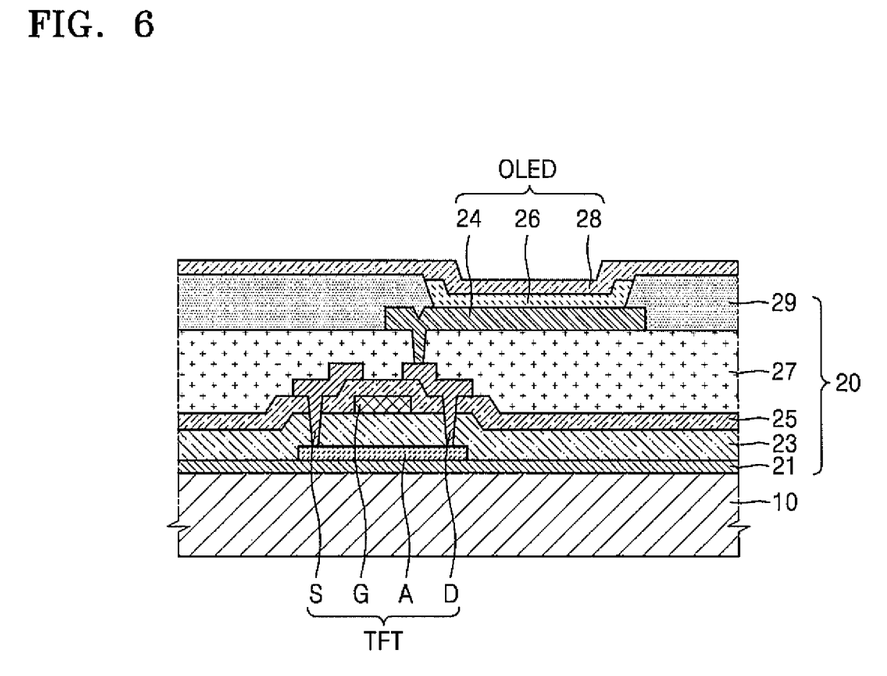
FIG. 6 is a schematic cross-sectional view illustrating a display portion of a display device according to an exemplary embodiment.
Figure 7:
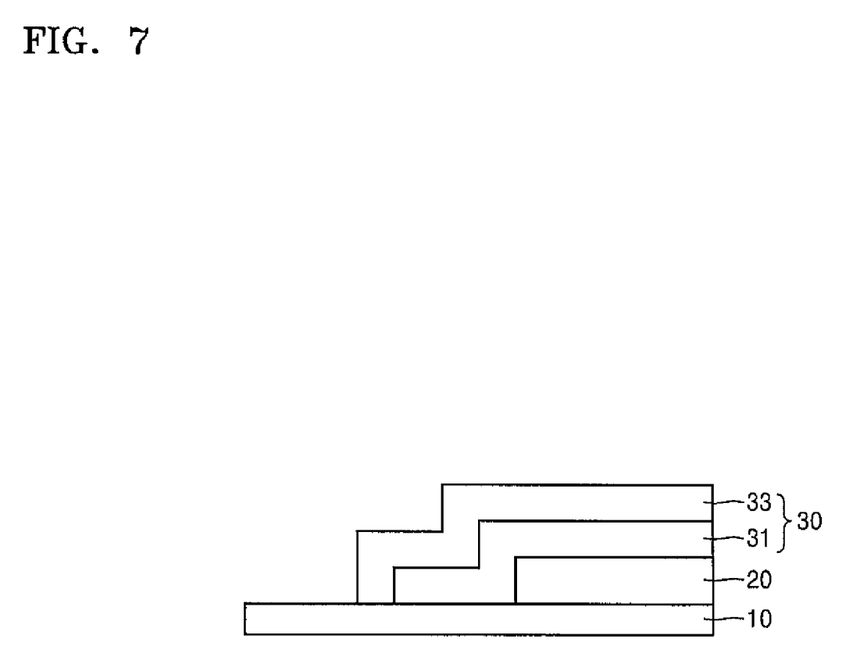
FIG. 7 is a schematic cross-sectional view illustrating a display device manufactured by using a mask according to an exemplary embodiment.

FIG. 5 is a cross-sectional view illustrating an operation of forming an organic layer of a display device by using a mask according to an exemplary embodiment, FIG. 6 is a schematic cross-sectional view illustrating a display portion of a display device according to an exemplary embodiment, and FIG. 7 is a schematic cross-sectional view illustrating a display device manufactured by using a mask according to an exemplary embodiment.

In FIGS. 5 to 7, like reference numerals used in FIGS. 1 to 2C represent like members, and repeated descriptions of the like members may be omitted for conciseness of description.

For convenience in description, a method of forming an organic layer by using the mask 1000 according to an exemplary embodiment illustrated in FIG. 2A is described with reference to FIG. 5. However, the mask used for a method of manufacturing a display device according to an exemplary embodiment is not limited thereto.

In a display device according to an exemplary embodiment, a display portion 20 may be formed on an upper portion of the substrate 10 first. A display region of the display portion 20 may include an array of pixels, and each of the pixels may include thin film transistors and a light-emitting device controlled by the thin film transistor. The light-emitting device may be an organic light-emitting device that emits light spontaneously.

The description hereinafter shows a case in which the display portion 20 includes an organic light-emitting device, for convenience of description. The display portion 20 according to the present exemplary embodiment is not limited to the case where the display portion 20 includes an organic light-emitting device.

As illustrated in FIG. 6, in the display device according to the present exemplary embodiment, a buffer layer 21 may be formed on the upper portion of the substrate 10. The buffer layer 21 may prevent or reduce diffusion of impurity ions and penetration of moisture or air, and may serve as a barrier layer and/or a blocking layer for planarizing a surface of the substrate 10.

A thin film transistor (TFT) may be formed on the upper portion of the buffer layer 21. A semiconductor layer A of the TFT may include polysilicon, and may include a channel region undoped with impurities, and may also include a source region and a drain region respectively doped with impurities and located at respective sides of the channel region. Here, the impurities differ depending on a kind of the TFT, and may be N-type impurities or P-type impurities.

After the semiconductor layer A is formed, a gate insulating layer 23 may be formed on the upper portion of the semiconductor layer A over the entire surface of the substrate 10. The gate insulating layer 23 may include a single layer, or may include multiple layers including an inorganic material, such as a silicon oxide or a silicon nitride, etc. The gate insulating layer 23 insulates the semiconductor layer A from a gate electrode G disposed thereon.

After the gate insulating layer 23 is formed, the gate electrode G may be formed on an upper portion of the gate insulating layer 23. The gate electrode G may be formed via a photolithography process and/or an etching process. The gate electrode G may include one or more metals of Mo, Al, Pt, Pd, Ag, Mg, Au, Ni, Nd, Ir, Cr, Li, Ca, Ti, W, and/or Cu.

After the gate electrode G is formed, a first intermediate layer insulating layer 25 may be formed on the entire surface of the substrate 10. The first intermediate layer insulating layer 25 may include an inorganic material. For example, the first intermediate layer insulating layer 25 may include a metallic oxide and/or a metallic nitride. Specifically, the inorganic material may include $SiO_2$, $SiNx$, $SiON$, $Al_2O_3$, $TiO_2$, $Ta_2O_5$, $HfO_2$, and/or $ZnO_2$, etc. The first intermediate layer insulating layer 25 may include multiple layers, or may include a single layer including an inorganic material such as $SiOx$ and/or $SiNx$, etc. In some exemplary embodiments, the first intermediate layer insulating layer 25 may include a double-layer structure of $SiOx/SiNy$ and/or $SiNx/SiOy$.

A source electrode S and a drain electrode D of the TFT may be on an upper portion of the first intermediate layer insulating layer 25. The source electrode S and the drain electrode D may include one or more metals of Al, Pt, Pd, Ag, Mg, Au, Ni, Nd, Ir, Cr, Li, Ca, Mo, Ti, W, and/or Cu.

Referring to FIG. 6, a via layer 27 is formed on the entire surface of the substrate 10 to cover the source electrode S and the drain electrode D. A pixel electrode 24 may be formed on the upper portion of the via layer 27. According to an exemplary embodiment illustrated in FIG. 6, the pixel electrode 24 is connected with the drain electrode D through a via hole formed in the via layer 27. The via layer 27 may include an insulating material. For example, the via layer 27 may include a single layer, or may include multiple layers including an inorganic material, an organic material, and/or an organic/inorganic compound, and may be formed by using various suitable deposition methods.

As illustrated in FIG. 6, an organic light-emitting device (OLEO) is provided on the upper portion of the via layer 27. The OLED includes the pixel electrode 24, an intermediate layer 26 including an organic emission layer, and an opposite electrode 28. Also, the organic light-emitting display device of FIG. 6 may further include, or may be partially surrounded by, a pixel-defining layer 29.

The pixel electrode 24 and/or the opposite electrode 28 may be provided as a transparent electrode or a reflective electrode. When the pixel electrode 24 and/or the opposite electrode 28 are provided as a transparent electrode, they may include ITO, IZO, ZnO, and/or $In_2O_3$. When the pixel electrode 24 and/or the opposite electrode 28 are provided as a reflective electrode, they may include a reflective layer including Ag, Mg, Al, Pt, Pd, Au, Ni, Nd, Ir, Cr, and/or a compound thereof, etc., and a transparent layer including ITO, IZO, ZnO, and/or $In_2O_3$. In some exemplary embodiments, the pixel electrode 24 or the opposite electrode 28 may have an ITO/Ag/ITO structure.

The pixel electrode 24, the intermediate layer 26, and the opposite electrode 28 form the OLED. Holes and electrons respectively injected from the pixel electrode 24 and the opposite electrode 28 of the OLED recombine in the organic emission layer of the intermediate layer 26 to emit light.

The intermediate layer 26 may include the organic emission layer. As another exemplary embodiment, the intermediate layer 26 may include the organic emission layer and at least one of a hole injection layer (HIL), a hole transport layer, an electron transport layer, and/or an electron injection layer. However, the present exemplary embodiment is not limited thereto, and the intermediate layer 26 may include the organic emission layer and/or other various suitable functional layers.

The opposite electrode 28 is located on the intermediate layer 26. The opposite electrode 28 forms an electric field with the pixel electrode 24 to allow light to be emitted from the intermediate layer 26. The pixel electrode 24 may be patterned at every pixel, and the opposite electrode 28 may be formed such that a common voltage is applied to all pixels.

The pixel electrode 24 may serve as an anode electrode, and the opposite electrode 28 may serve as a cathode electrode. However, they are not limited thereto, and, for example, the pixel electrode 24 may serve as a cathode electrode, and the opposite electrode 28 may serve as an anode electrode.

As illustrated in FIG. 7, after the display portion 20 including the OLED is formed on the upper portion of the substrate 10, a thin film encapsulation portion 30 for sealing the display portion 20 may be formed on the display portion 20. The thin film encapsulation portion 30 may include an organic layer 31 and an inorganic layer 33, and FIG. 5 schematically illustrates an operation of forming the organic layer 31 first.

As illustrated in FIG. 5, during a process of depositing a monomer 31a in a liquid state on the substrate 10 where the display portion 20 is formed, thereby covering the display portion 20, and then curing the monomer 31a with ultraviolet (UV) light to form a polymer, the half-etching portion 250 is formed in the mask 1000 according to an exemplary embodiment, so that the flexibility of the mask 1000 increases. Therefore, by doing so, a deterioration of a contact force between the substrate 10 and the mask 1000 may be avoided, and thus the spreading of the monomer 31a in the liquid state between the substrate 10 and the mask 1000 may also be avoided.

That is, a situation may be avoided in which the monomer 31a overflows to a portion hidden by the mask 1000, where UV light is not illuminated to the monomer 31a, such that the monomer 31a remains uncured. Accordingly, a cured organic layer 31 may be formed on a desired region as illustrated in FIG. 7.

As illustrated in FIG. 7, a display device according to an exemplary embodiment may include the substrate 10, the display portion 20 on the upper portion of the substrate 10, and a thin film encapsulation portion 30 for protecting the display portion 20 from penetration of external moisture or oxygen by sealing the display portion 20.

The thin film encapsulation portion 30 may have the organic layer 31 that directly covers the display portion 20, and the inorganic layer 33 that covers the organic layer 31. Though FIG. 7 illustrates only a double-layer structure including the organic layer 31 and the inorganic layer 33, the thin film encapsulation portion 30 is not limited thereto, and may be formed in a multi-layer structure including two or more layers.

The inorganic layer 33 may solidly block penetration of oxygen or moisture, and the organic layer 31 may absorb stress of the inorganic layer 33 to give flexibility to the display device. The inorganic layer 33 may be a single layer, or may include multiple stacked layers including a metallic oxide or a metallic nitride. Specifically, the inorganic layers may include one of SiNx, $Al_2O_3$, $SiO_2$, and/or $TiO_2$.

The organic layer 31 may include a polymer, and for example, may be a single layer, or may include multiple stacked layers including one of polyethylene terephthalate, polyimide, polycarbonate, epoxy, polyethylene, and/or polyacrylate. For example, the organic layers may include polyacrylate. Specifically, the organic layers may include a polymerized monomer composition including a diacrylate-based monomer and a triacrylate-based monomer. The monomer composition may further include a monoacrylate-based monomer. Also, the monomer composition may further include a photoinitiator such as TPO but is not limited thereto.

The display device according to an exemplary embodiment may prevent or substantially prevent penetration of oxygen and moisture, and may concurrently secure flexibility by forming the thin film encapsulation portion 30 in a structure in which the organic layer 31 and the inorganic layer 33 are stacked alternately.

The display device illustrated in FIG. 7 may be manufactured via the following process.

First, a mask may be located on the substrate 10 where the display portion 20 is formed. This mask includes a frame, and includes a mask base including a first surface and a second surface. A half-etching portion may be formed in at least a portion of the first surface and/or the second surface of the mask base. Also, two or more openings, through which light including UV light may be illuminated, may be formed in the mask base, and the half-etching portion may be formed in the surface of the mask base in a concavo-convex shape by an etching process.

Next, an organic layer material is deposited on the display portion 20. Because it is difficult to directly deposit a polymer such as polyacrylate, etc., which is an organic layer material, the polymer is made as a monomer in a liquid state. The monomer is deposited on the display portion 20, and the monomer is polymerized by illuminating UV light to the monomer.

Therefore, the monomer 31a (refer to FIG. 5) in a liquid state is deposited to cover the display portion 20. After that, when UV light is illuminated, the UV light is illuminated via an opening by the mask, so that the liquid monomer 31a is polymerized as a polymer, and the organic layer 31 may be formed. At this point, becaues the organic layer 31 is formed by the mask in which the half-etching portion is formed, the flexibility of the mask increases, and contact force between the substrate 10 and the mask at the outer portion of the mask improves, so that a phenomenon whereby the liquid monomer 31a spreads between the substrate 10 and the mask may be controlled or prevented.

Subsequently, the inorganic layer 33 may be formed on the upper portion of the organic layer 31 by disposing a mask for an inorganic layer on the substrate 10, and by sputtering an inorganic layer material on the mask for the inorganic layer. At this point, the inorganic layer 33 may cover the entire organic layer 31.

Therefore, the outer portion of the thin film encapsulation portion 30 is covered with the inorganic layer 33 having excellent damp proof properties, and the organic layer 31 is formed without an uncured portion, and is not exposed to the exterior of the display device, so that the solid thin film encapsulation portion 30 may be implemented, and consequently, the reliability of a display device may improve.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a display device, the method comprising:
   forming a display portion on a substrate;
   preparing a first mask comprising:
      a frame; and
      a mask base comprising:
         a first surface;
         a second surface; and
         a half-etching portion in a portion of the first surface or the second surface, wherein the half-etching portion continuously extends along each side at an outer portion of the mask base;
   forming an organic layer using the first mask;
   preparing a second mask for an inorganic layer; and
   forming the inorganic layer to cover the organic layer using the second mask,
   wherein the half-etching portion is at a corner of the mask base, and
   wherein the half-etching portion is inside a welding portion.

2. The method of claim 1, wherein the preparing of the first mask comprises:
   forming the half-etching portion in the mask base; and
   welding the mask base to the frame.

3. The method of claim 1, wherein the display portion comprises an organic light-emitting device.

4. The method of claim 1, wherein the half-etching portion at least partially surrounds a center portion of the mask base.

5. The method of claim 1, wherein the mask base comprises the welding portion that extends along each side of an outer portion of the mask base.

6. The method of claim 1, wherein the mask base comprises the welding portion that continuously extends along each side of an outer portion of the mask base.

7. A mask comprising:
   a frame; and
   a mask base attached to the frame and defining an opening through which light may be illuminated, the mask base comprising:
      a first surface;
      a second surface opposite to the first surface;
      a welding portion at an outer portion of the mask base; and
      a half-etching portion at a portion of at least one of the first surface and the second surface,
   wherein the half-etching portion continuously extends along each side at an outer portion of the mask base,
   wherein the half-etching portion is at a corner of the mask base, and
   wherein the half-etching portion is inside the welding portion.

8. The mask of claim 1, wherein the half-etching portion is between the opening and the welding portion.

9. The mask of claim 1, wherein the half-etching portion is in a pattern across an entire surface of the mask base.

10. The mask of claim 1, wherein the mask is configured to be used for curing an organic thin film encapsulation layer with ultraviolet light.

11. The mask of claim 1, wherein the half-etching portion at least partially surrounds a center portion of the mask base.

12. The mask of claim 1, wherein the welding portion extends along each side of the outer portion of the mask base.

13. The mask of claim 1, wherein the welding portion continuously extends along each side of the outer portion of the mask base.

* * * * *